United States Patent
Hung et al.

(10) Patent No.: US 10,042,173 B2
(45) Date of Patent: Aug. 7, 2018

(54) LASER INTERFERENCE LITHOGRAPHY SYSTEM WITH FLAT-TOP INTENSITY PROFILE

(71) Applicant: NATIONAL SUN YAT-SEN UNIVERSITY, Kaohsiung (TW)

(72) Inventors: Yung-Jr Hung, Kaohsiung (TW); Han-Jung Chang, Kaohsiung (TW)

(73) Assignee: NATIONAL SUN YAT-SEN UNIVERSITY, Kaohsiung (TW)

( * ) Notice: Subject to any disclaimer, the term of this patent is extended or adjusted under 35 U.S.C. 154(b) by 0 days.

(21) Appl. No.: 15/586,407

(22) Filed: May 4, 2017

(65) Prior Publication Data

US 2017/0329146 A1    Nov. 16, 2017

(30) Foreign Application Priority Data

May 12, 2016    (TW) .............................. 105114700 A

(51) Int. Cl.
*G02B 27/09*   (2006.01)
*G02B 27/28*   (2006.01)

(52) U.S. Cl.
CPC ....... *G02B 27/0927* (2013.01); *G02B 27/095* (2013.01); *G02B 27/0944* (2013.01); *G02B 27/283* (2013.01)

(58) Field of Classification Search
CPC .............. G02B 5/3083; G02B 27/0927; G02B 27/0944; G02B 27/095; G02B 27/0977
USPC ............... 359/352, 489.07, 489.09, 566, 577
See application file for complete search history.

(56) References Cited

U.S. PATENT DOCUMENTS

| | | | | |
|---|---|---|---|---|
| 4,469,407 A | * | 9/1984 | Cowan | G02B 27/58 359/15 |
| 5,910,235 A | * | 6/1999 | Gornicki | G11B 5/82 204/192.2 |
| 8,681,315 B2 | | 3/2014 | Mao et al. | |
| 9,823,422 B2 | * | 11/2017 | Muendel | G02B 6/32 |

(Continued)

FOREIGN PATENT DOCUMENTS

TW    201416802    5/2014

OTHER PUBLICATIONS

Shi-Yuan Tseng, A study on fabrication of one-dimensional periodic gratings by using holographic lithography, Master Thesis of National Chiao Tung University, 2007.

(Continued)

*Primary Examiner* — Ricky D Shafer
(74) *Attorney, Agent, or Firm* — Jackson IPG PLLC; Demian K. Jackson

(57) ABSTRACT

A laser interference lithography system with flat-top intensity profile comprises a laser source for emitting a coherent laser beam, a first beam expander for adjusting the coherent laser beam size, a refractive beam shaper for converting a Gaussian intensity profile inherent to the coherent laser beam into a flat-top one and outputting a first collimated laser beam, a second beam expander for receiving the first collimated laser beam and outputting a second collimated laser beam, a sample holder for holding a substrate, and at least one reflector for reflecting the second collimated laser beam to generate a third collimated laser beam. The second and third collimated laser beams are transmitted to the substrate at a predetermined angle to create an interference pattern exposed onto the substrate.

12 Claims, 4 Drawing Sheets

(56) References Cited

U.S. PATENT DOCUMENTS

| | | | | |
|---|---|---|---|---|
| 9,904,176 B2* | 2/2018 | Hung | ................ | G03F 7/70191 |
| 2001/0035991 A1 | 11/2001 | Hobbs et al. | | |
| 2005/0170572 A1* | 8/2005 | Hongo | ............... | B23K 26/0738 |
| | | | | 438/166 |
| 2006/0092430 A1* | 5/2006 | Lizotte | ................... | G01B 11/25 |
| | | | | 356/600 |
| 2006/0139629 A1* | 6/2006 | Ohshima | ................ | G01N 21/47 |
| | | | | 356/237.2 |
| 2013/0017498 A1* | 1/2013 | Mao | ................... | G02B 26/0816 |
| | | | | 430/322 |
| 2013/0308112 A1* | 11/2013 | Clube | ................. | G03F 7/70408 |
| | | | | 355/67 |
| 2014/0050861 A1* | 2/2014 | Vaidyanathan | ......... | C23C 16/56 |
| | | | | 427/554 |

OTHER PUBLICATIONS

Taiwanese Office Action dated Apr. 25, 2017 for Taiwanese Patent Application No. 105114700, 3 pages.

\* cited by examiner

LASER INTERFERENCE LITHOGRAPHY SYSTEM WITH FLAT-TOP INTENSITY PROFILE

FIELD OF THE INVENTION

This invention relates to a laser interference lithography system, and more particularly relates to a laser interference lithography system capable of providing a flat-top intensity profile with a large exposure area for nano-patterning.

BACKGROUND OF THE INVENTION

Laser interference lithography (LIL) is an inexpensive approach for fabricating periodic structures, wherein LIL utilizes two mutually-interfered coherent laser beams to form periodic interference fringes. While the photosensitive material (e.g. photoresist) is exposed to the interference fringes, the patterns of the periodic interference fringes can be transferred to the photoresist to form periodic grating structures, and furthermore, the periodic grating structures on the photoresist can be transferred to various materials by etching techniques. Low-cost and high-throughput LIL is widely used for distributed feedback semiconductor laser fabrication for telecommunication applications, which requires a grating periodicity of around 200 nm uniformly over a 2-inch III-V epi-wafer. In addition, LIL can be applied to fabricate patterned sapphire substrates for light-emitting diode applications, and fabricate wire-grid polarizer for display, wherein the formation of short-period gratings uniformly over a larger sample area is the major objective of LIL.

A Lloyd's mirror interferometer is the most common approach to conduct LIL process, in which a reflecting mirror is placed perpendicular to a sample holder. A laser beam with an enlarged light field is utilized to illuminate the reflecting mirror and the sample holder, simultaneously, wherein the beam reflected from the reflecting mirror illuminates the sample holder as the second beam for two-beam interference process. The LIL system equipped with a Lloyd's mirror is simple in system setup and not susceptible to environmental disturbance, but it can not be applied to generate uniform periodic structures over a large sample area because the energy distribution of the two beams in the system are non-uniform and respectively right and left sides of Gaussian intensity profile. While the two beams interfere mutually, the exposure dose on the sample region close to the reflecting mirror is higher than that far away from the reflecting mirror, so the uniformity of the grating structure on the sample is not sufficient.

A novel tunable two-mirror LIL system was disclosed in U.S. Pat. No. 8,681,315 (Mao et al, 2011), wherein two additional reflecting mirrors are utilized in this novel system to adjust the paths of two expanded beams for different interference fringe periodicity, without altering the configuration of other optical components, and the grating structure over 4-inch can be obtained. However, the uniformity of the grating structure is still insufficient and the issue arise from Gaussian intensity profile still exists. For this reason, a laser interference lithography system with flat-top intensity profile to solve the existing problem in prior art is required.

SUMMARY

The primary object of the present invention is to provide a laser interference lithography system with flat-top intensity profile, which is adapted to flatten/uniformize the Gaussian intensity profile of laser beams to enable a more uniform light field before the interference takes place, hence uniform exposure dose over a large sample area can be possible.

A laser interference lithography system with flat-top intensity profile comprises a laser source for emitting a coherent laser beam; a first beam expander for adjusting the coherent laser beam size; a refractive beam shaper for converting a Gaussian intensity profile inherent to the coherent laser beam into a flat-top intensity profile and outputting a first collimated laser beam; a second beam expander for receiving the first collimated laser beam and outputting a second collimated laser beam, wherein the second collimated laser beam is larger in size than the first collimated laser beam; a sample holder for holding a substrate; and at least one reflector for receiving and reflecting the second collimated laser beam to form a third collimated laser beam, wherein the second and third collimated laser beams are transmitted to the substrate at a predetermined angle to produce an interference pattern on the substrate.

DETAILED DESCRIPTION OF THE INVENTION

Figure 1:
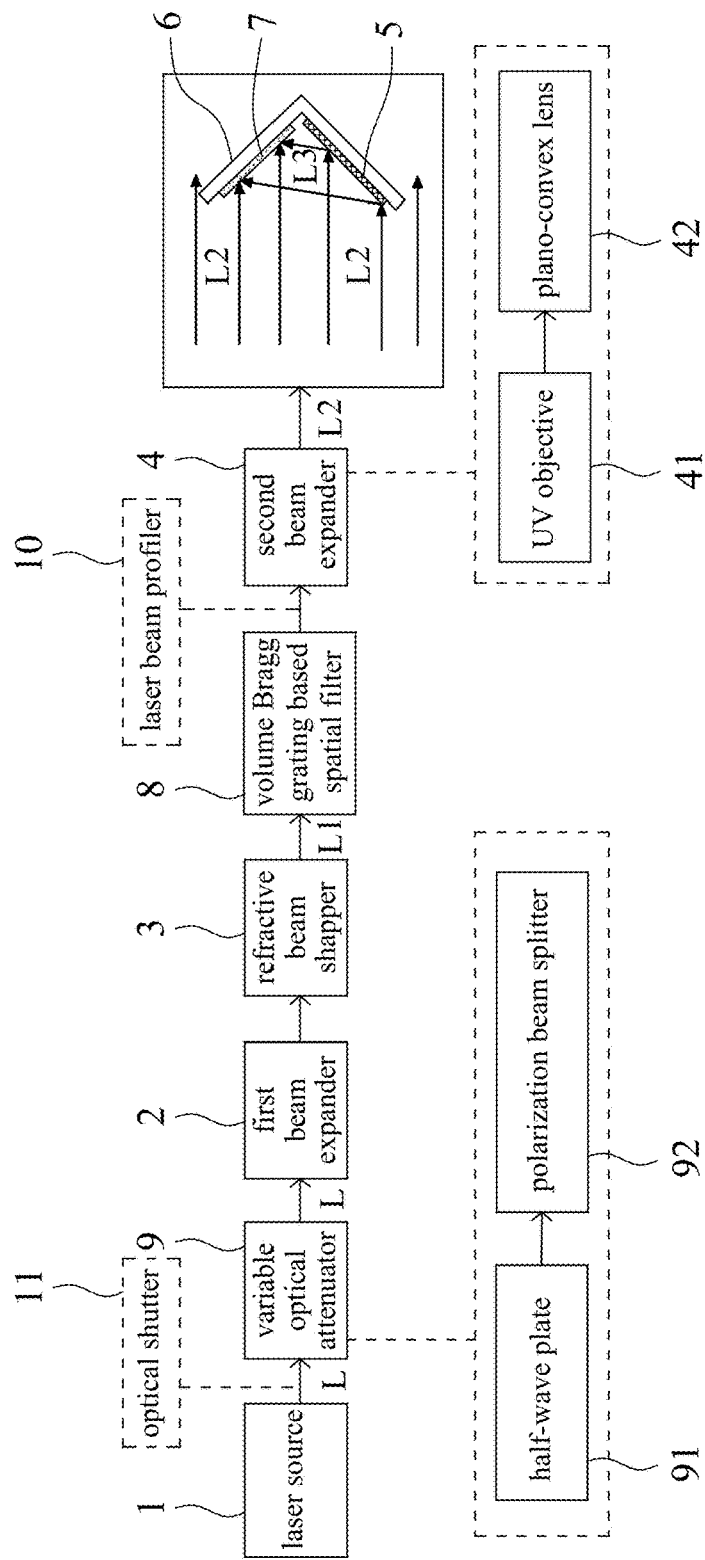
FIG. 1 is a schematic diagram illustrating a laser interference lithography system with flat-top intensity profile in accordance with a first embodiment of the present invention.

With reference to FIG. 1, a laser interference lithography system with flat-top intensity profile 100 of a first embodiment of the present invention comprises a laser source 1, a first beam expander 2, a refractive beam shaper 3, a second beam expander 4, a reflector 5 and a sample holder 6. The laser source 1 is provided for emitting a coherent laser beam L whose wavelength is 325 nm, 355 nm, 365 nm, 405 nm, or other ultraviolet (UV) wavelengths. In the first embodiment, a diode-pumped solid-state (DPSS) laser with an output power of 100 mW, a wavelength of 355 nm and a coherent length exceeding 40 m is preferably adapted as the laser source 1, wherein the DPSS laser has a relatively compact size (125 mm×70 mm×45 mm). UV gas lasers such as Helium-Cadmium (He—Cd) laser also can be adapted to emit the coherent laser beam L, but its coherent length is only 30 cm, and with bulky size and shorter lifetime. Preferably, an optical shutter 11 disposed between the laser source 1 and the first beam expander 2 is provided to control the total exposure time during LIL process.

The refractive beam shaper 3 can convert the Gaussian distribution inherent to the coherent laser beam L into flat-top distribution, and output a first collimated laser beam L1. The beam size of the coherent laser beam L is usually around 1 mm, which is smaller than the required beam size for the refractive beam shaper 3. The first beam expander 2 is preferably disposed between the laser source 1 and the refractive beam expander 3 to enlarge the beam size of the coherent laser beam L precisely to a predetermined value ideal for the refractive beam shaper 3. Preferably, the first beam expander 2 is a 2×-10× tunable beam expander utilized to enlarge the beam size from originally 0.7 mm to 6 mm, so the beam size of the first collimated laser beam L1 is approximately 6 mm. Furthermore, if the laser source 1 emits the coherent laser beam L with a ideal Gaussian $TEM_{00}$ mode and a beam divergence angle of 75 mrad, after passing the refractive beam shaper 3 the output laser beam will have a flat-top and uniform intensity profile, wherein the intensity variation is within 5%. However, in practice the intensity variation of the output laser beam is approximately between 5% and 10%.

The second beam expander 4 is adapted to receive and expand the first collimated laser beam L1, and then output a second collimated laser beam L2 with a larger beam size than the first collimated laser beam L1, wherein the refractive beam shaper 3 and the second beam expander 4 are preferably separated by a distance smaller than 20 cm. The second beam expander 4 can be selected from at least one of the group consisting of a UV objective, a plano-convex lens and a plano-concave lens, and the selection is based on beam expanding requirement and convenience in operation. With reference to FIG. 1, the second beam expander 4 of the first embodiment is composed of a UV objective 41 and a plano-convex lens 42 which are disposed between the refractive beam shaper 3 and the reflector 5, wherein the UV objective 41 can be a 20× UV objective, and the area of the plano-convex lens 42 is not limited. The plano-convex lens 42 is utilized to generate an expanded and collimated laser beam so the incident angles of the laser beams to the substrate are fixed, thus leads to a uniform grating pattern with less than 1 nm variation in grating periodicity over the entire illumination area.

With reference to FIG. 1, the reflector 5 is placed on the sample holder 6 and substantially perpendicular to a substrate 7 on the sample holder 6 for single-beam Lloyd's mirror interferometer. Meanwhile, the illumination region of the second collimated laser beam L2 covers the reflector 5 and the substrate 7, so the reflector 5 receives and reflects the second collimated laser beam L2 to create a third collimated laser beam L3, and the second collimated laser beam L2 and the third collimated laser beam L3 are transmitted to the substrate 7 at a predetermined angle to produce a interference pattern (drawing not shown) on the substrate 7. While there is a photosensitive layer (e.g. photoresist) deposited on the substrate 7, the interference pattern can be utilized to produce a one-dimensional (1D) periodic interference fringe through the first exposure. And in other case, the second exposure of the 1D periodic interference fringe with the sampled rotated 90° can be executed to form a two-dimensional (2D) periodic interference fringe. Preferably, the substrate 7 is, but not limited to, a semiconductor laser epi-wafer provided for photoresist patterning by LIL process, wherein the area of the substrate 7 may be larger than 2-inch, and the variation in fill factor of the interference pattern formed on the substrate 7 is lower than 5%, which implies that the fill factor differences at all positions of the substrate 7 are within 5%.

Further with reference to FIG. 1, a spatial filter is preferably used in the first embodiment of the present invention to filter out the noise of the laser source 1 and to reduce the diffraction effects of the entire optical system caused by dusts. A pinhole filter is conventionally utilized as the spatial filter, but it may reduce the intensity uniformity of the flat-top laser beam after passing through the pinhole filter. Therefore, a volume Bragg grating based spatial filter 8, other than the conventional pinhole filter, is applied in the first embodiment of the present invention to filter out the laser noise. The function of the volume Bragg grating based spatial filter 8 is the same as the conventional pinhole filter, but the mechanism of volume Bragg grating as a spatial filter is based on its critical incident angle of the laser beam to be diffracted by its periodic structure. In practical implementations, the volume Bragg grating based spatial filter 8 utilizes two transmission-type volume Bragg gratings in series, so the incident light having a divergence angle larger than 2.6 mrad will be filtered out as noise, wherein the optical transmittance is over 75%. In other embodiment, a reflection-type volume Bragg grating also can be utilized for the same filtering purpose, and the incident light having a divergence angle larger than 1.6 mrad will be filtered out, wherein the optical transmittance is approximately 60%. The primary objective of the spatial filter is to filter out the noise of the output laser beam, and the position of the spatial filter in the proposed LIL setup is flexible. The spatial filter can be disposed between the laser source 1 and the first beam expander 2 (directly at the output of the laser source 1), between the first beam expander 2 and the refractive beam shaper 3, or between the refractive beam shaper 3 and the second beam expander 4. Preferably, the spatial filter is disposed between the refractive beam shaper 3 and the second beam expander 4 in the first embodiment for simultaneously filtering out the stray light caused by dusts.

With reference to FIG. 1, a variable optical attenuator 9 is provided to control the output power of the laser source 1 in order to measure the intensity profile of the second collimated laser beam L2 by a laser beam profiler 10 disposed between the refractive beam shaper 3 and the second beam expander 4, wherein the variable optical attenuator 9 is disposed between the laser source 1 and the first beam expander 2. In practical implementations, the variable optical attenuator 9 consists of a half-wave plate 91 and a polarization beam splitter 92, wherein the half-wave plate 91 is utilized for polarization rotation of the incident beam while the polarization beam splitter 92 is utilized to split the beam with specific polarization direction for adjusting the output power of the coherent laser beam L and maintaining the vertical polarization and the beam size of the coherent laser beam L.

Figure 2:
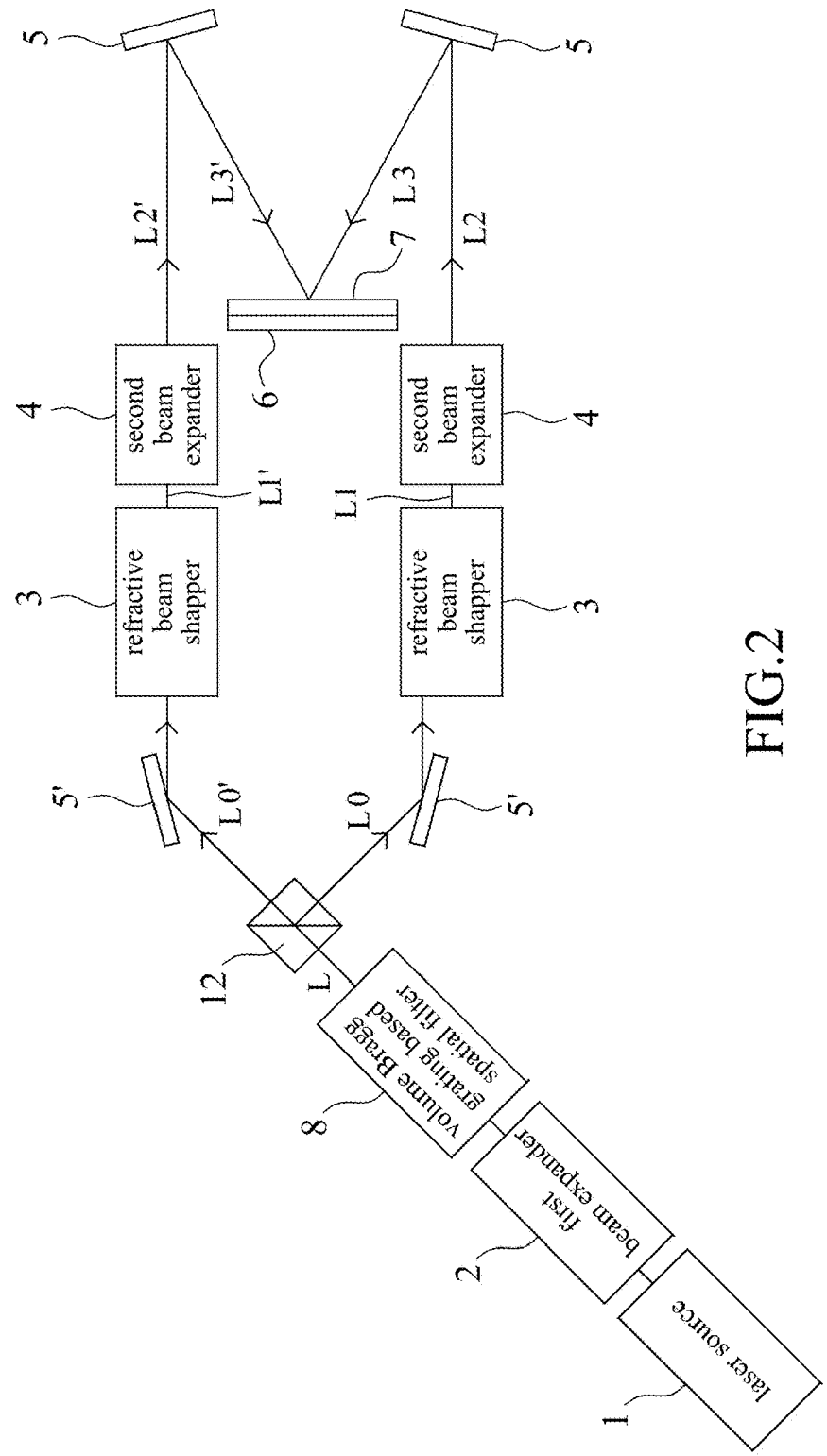
FIG. 2 is a schematic diagram illustrating a laser interference lithography system with flat-top intensity profile in accordance with a second embodiment of the present invention.

With reference to FIG. 2, it is the configuration of a laser interference lithography system with flat-top intensity profile 100 of a second embodiment of the present invention, wherein the numerals of the same elements in FIG. 2 are consistent with those in FIG. 1. The laser interference lithography system with flat-top intensity profile 100 of the second embodiment comprises a laser source 1, a first beam expander 2, a beam splitter 12, two refractive beam shapers 3, two second beam expanders 4, two reflectors 5 and a sample holder 6. The difference between the first and second embodiments is that the beam splitter 12 is disposed between the first beam expander 2 and the refractive beam shaper 3 for splitting the coherent laser beam L into two coherent laser beams L0 and L0', whose intensity are substantially half of that of the original coherent laser beam L. For example, the beam splitter 12 is a cube beam splitter. Two coherent laser beams L0 and L0' can then be directed into the refractive beam shaper 3 by additional reflectors 5'.

In the second embodiment, a spatial filter is utilized to filter out the noise of the laser source 1, wherein the spatial filter is installed between the first beam expander 2 and the beam splitter 12. The spatial filter is a volume Bragg grating based spatial filter 8, which includes but is not limited to a transmission-type volume Bragg grating or a reflection-type volume Bragg grating, and the beam splitter 12 is disposed between the volume Bragg grating based spatial filter 8 and the refractive beam shaper 3. Since the spatial filter in the second embodiment is placed before the refractive beam shaper 3, a pinhole-based spatial filter can also be utilized. Other elements identical to those of the first embodiment repeat no more here.

As mentioned above, 1D or 2D interference patterns on the substrate 7 with photoresist material thereon can be fabricated by the laser interference lithography system with flat-top intensity profile 100 of the present invention, and the 2D periodic interference fringe can be obtained through two exposure steps, wherein the substrate 7 is rotated at a predetermined angle before the second exposure step.

Figures 3A, 3B:
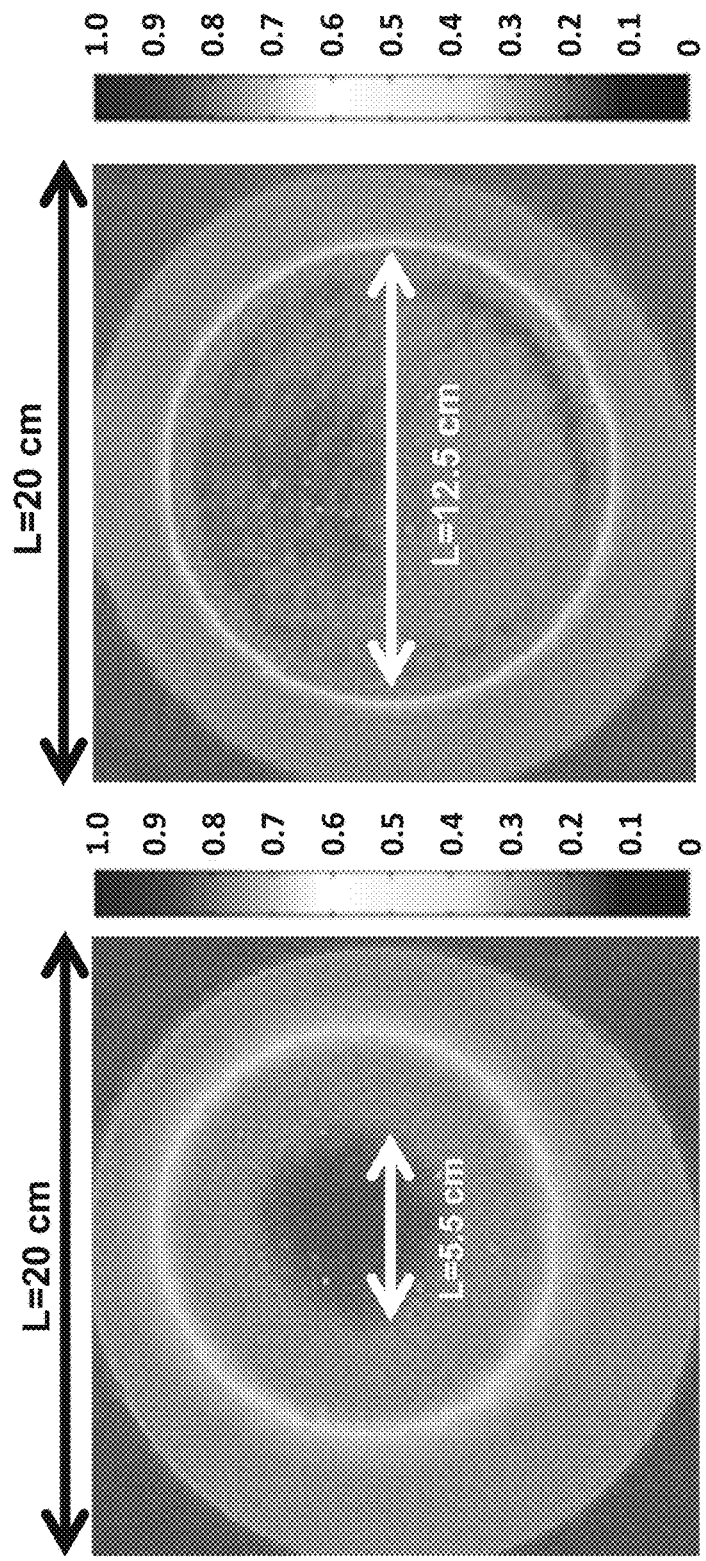
FIG. 3A is a light field distribution image of coherent laser beam before intensity uniformization.
FIG. 3B is a light field distribution image of coherent laser beam after intensity uniformization.

For practical demonstration of the laser interference lithography system with flat-top intensity profile 100 of the present invention, the intensity distribution of the expanded Gaussian and flat-top laser beams are referred to FIGS. 3A and 3B, respectively. FIGS. 3A and 3B reveal that after light expansion a flat-top laser beam can provide a uniform light field area of approximately 12.5 cm in diameter, that is about two times larger than that provided by the Gaussian laser beam (about 5.5 cm in diameter). Therefore, an expanded and uniform light field can be directed to the sample holder 6 to create uniform interference fringe for LIL process.

Figure 4:
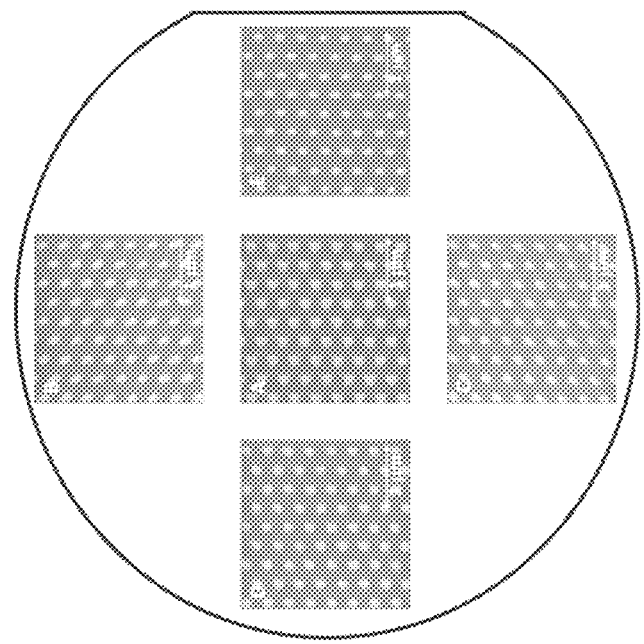
FIG. 4 is a scanning emission microscopy (SEM) image of periodic structures on 2-inch silicon substrate produced by a laser interference lithography system with flat-top intensity profile of the present invention.
Figure 5:
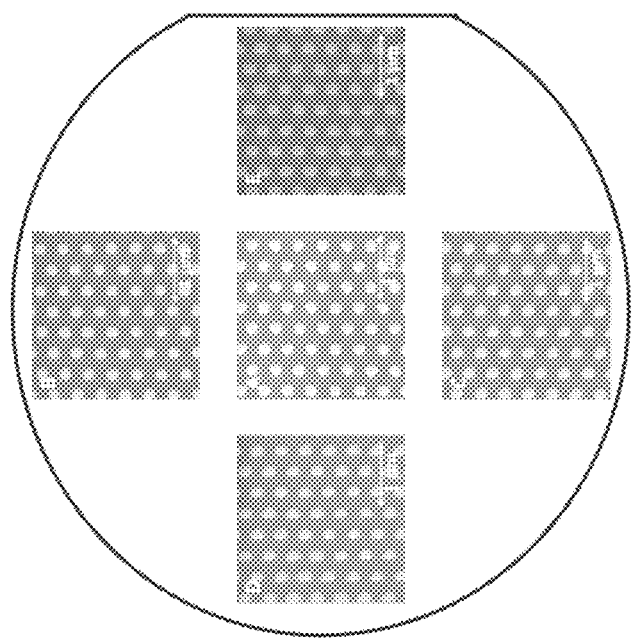
FIG. 5 is a scanning emission microscopy (SEM) image of periodic structures on 2-inch silicon substrate produced by a conventional laser interference lithography system.

FIG. 4 shows the SEM images of resultant 2D periodic photoresist patterns on a 2-inch silicon substrate produced by the laser interference lithography system with flat-top intensity profile 100 of the present invention. As shown in FIG. 4, the 2D periodic structures on the peripheral positions B, C, D and E of the wafer, which correspond to top, bottom, left and right of the wafer, respectively, have similar morphology to that on the center position A of the wafer. In the meanwhile, FIG. 5 shows the SEM images of resultant 2D periodic photoresist patterns on a 2-inch silicon substrate produced by a conventional laser interference lithography system with a Gaussian light field. The morphology of the 2D periodic structures on the peripheral positions B, C, D and E of the wafer varies with respect to the exposure energy variation during two exposure steps and are highly different from the morphology at the center position A.

With reference to Table I, the fill factor is defined as the volume fraction of photoresist material remaining on the sample after development while the ellipticity is defined as the diameter ratio between the major axis and the minor axis of the ellipse, wherein an ellipticity of 1 corresponds to a circular geometry. Table I reveals that the fill factor and ellipticity of the 2D periodic structures produced with a non-uniform Gaussian light field are 0.0787-0.184 and 1.07-1.66, respectively. In contrast, the fill factor and ellipticity of the 2D periodic structures produced with a flat-top light field are 0.135-0.160 and 1.00-1.06, respectively, showing its great promise for wafer-scale nano-patterning applications. Hence the laser interference lithography system with flat-top intensity profile 100 of the present invention can be utilized to fabricate periodic structures uniformly over a large area and thus can be applied for a variety of applications that benefit from the nature of periodic nanostructures, including but not limited to distributed feedback laser fabrication for telecommunication applications.

TABLE I

| Position | Gaussian light field | | Flat-top light field | |
| --- | --- | --- | --- | --- |
| | Fill Factor | Ellipticity | Fill Factor | Ellipticity |
| A | 0.122 | 1.07 | 0.145 | 1.06 |
| B | 0.184 | 1.44 | 0.160 | 1.05 |
| C | 0.139 | 1.39 | 0.144 | 1.00 |
| D | 0.169 | 1.66 | 0.135 | 1.05 |
| E | 0.0787 | 1.27 | 0.147 | 1.04 |

Compared to conventional laser interference lithography system, the laser interference lithography system with flat-top intensity profile 100 of the present invention can improve the uniformity of light field and large-area periodic structure.

The scope of the present invention is only limited by the following claims. Any alternation and modification without departing from the scope and spirit of the present invention will become apparent to those skilled in the art.

What is claimed is:

1. A laser interference lithography system with flat-top intensity profile comprising:
    a laser source for emitting a coherent laser beam;
    a first beam expander for adjusting the coherent laser beam size;
    a refractive beam shaper for converting a Gaussian intensity profile inherent to the coherent laser beam into a flat-top intensity profile and outputting a first collimated laser beam;
    a second beam expander for receiving the first collimated laser beam and outputting a second collimated laser beam, wherein the second collimated laser beam is larger in size than the first collimated laser beam;
    a sample holder for holding a substrate; and
    at least one reflector for receiving and reflecting the second collimated laser beam to form a third collimated laser beam,
    wherein the second and third collimated laser beams are transmitted to the substrate at a predetermined angle to produce an interference pattern on the substrate.

2. The laser interference lithography system with flat-top intensity profile in accordance with claim 1 further comprises a variable optical attenuator which is disposed between the laser source and the refractive beam shaper.

3. The laser interference lithography system with flat-top intensity profile in accordance with claim 2, wherein the variable optical attenuator includes a half-wave plate and a polarization beam splitter.

4. The laser interference lithography system with flat-top intensity profile in accordance with claim 1, wherein the first beam expander is capable of adjusting the coherent laser beam size to approximately 6 mm.

5. The laser interference lithography system with flat-top intensity profile in accordance with claim 1, wherein the second beam expander is selected from at least one of the group consisting of a UV objective, a plano-convex lens and a plano-concave lens.

6. The laser interference lithography system with flat-top intensity profile in accordance with claim 1 further comprises at least one volume Bragg grating based spatial filter which is disposed between the refractive beam shaper and the second beam expander.

7. The laser interference lithography system with flat-top intensity profile in accordance with claim 1 further comprises at least one volume Bragg grating based spatial filter which is disposed between the laser source and the first beam expander.

8. The laser interference lithography system with flat-top intensity profile in accordance with claim 1 further comprises at least one volume Bragg grating based spatial filter which is disposed between the first beam expander and the refractive beam shaper.

9. The laser interference lithography system with flat-top intensity profile in accordance with claim 8 further comprises a beam splitter which is disposed between the volume Bragg grating based spatial filter and the refractive beam shaper.

10. The laser interference lithography system with flat-top intensity profile in accordance with claim 1 further comprises a laser beam profiler for measuring the intensity profile of the coherent laser beam, wherein the laser beam profiler is disposed between the refractive beam shaper and the second beam expander.

11. The laser interference lithography system with flat-top intensity profile in accordance with claim 1, wherein the refractive beam shaper and the second beam expander are separated by a distance smaller than 20 cm.

12. The laser interference lithography system with flat-top intensity profile in accordance with claim 1, wherein the substrate area is larger than 2 inch and a variation in fill factor of the interference pattern is smaller than 5%.

\* \* \* \* \*